(12) United States Patent
Lou

(10) Patent No.: US 6,235,579 B1
(45) Date of Patent: May 22, 2001

(54) METHOD FOR MANUFACTURING STACKED CAPACITOR

(75) Inventor: Chine-Gie Lou, Hsinchu Hsien (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 09/451,384

(22) Filed: Nov. 30, 1999

(30) Foreign Application Priority Data

Oct. 18, 1999 (TW) ................................. 088117959

(51) Int. Cl.[7] .............................................. H01L 21/8242
(52) U.S. Cl. .................................. 438/253; 438/3; 438/396
(58) Field of Search .................................... 438/3, 253, 396

(56) References Cited

U.S. PATENT DOCUMENTS

| | | | |
|---|---|---|---|
| 5,679,980 | * 10/1997 | Summerfelt | 257/751 |
| 6,001,686 | * 12/1999 | Ding | 438/253 |
| 6,043,529 | * 3/2000 | Hartner et al. | 257/306 |
| 6,130,449 | * 10/2000 | Matsuoka et al. | 257/296 |

\* cited by examiner

Primary Examiner—Charles Bowers
Assistant Examiner—William M. Brewster
(74) Attorney, Agent, or Firm—Jiawei Huang; J. C. Patents

(57) ABSTRACT

A method of manufacturing a stacked capacitor. A first dielectric layer is formed over a substrate. A first nitride layer is formed on the first dielectric layer. A storage node contact hole is formed to penetrate through the first nitride layer and the first dielectric layer and to expose a portion of the substrate. A first conductive plug is formed in the storage node contact hole. A second dielectric layer is formed on the first nitride layer and the first conductive plug. A second nitride layer is formed on the second dielectric layer. A contact hole is formed to penetrate through the second nitride layer and the second dielectric layer and to expose portions of the first conductive plug. A second conductive plug is formed in the contact hole with a surface level lower than a surface level of the second nitride layer. A metal barrier layer is formed on the second conductive plug and fills the contact hole. A first metal layer is formed over the substrate. The first metal layer, the second nitride layer and the second dielectric layer are patterned to form a storage node. The storage node comprises the second conductive plug and the metal barrier layer. A metal spacer is formed on the sidewall of the storage node. A third dielectric layer is formed over the substrate. A second metal layer is formed on the third dielectric layer.

23 Claims, 4 Drawing Sheets

METHOD FOR MANUFACTURING STACKED CAPACITOR

CROSS-REFERENCE TO RELATED APPLICATION

This application claims the priority benefit of Taiwan application serial no. 88117959, filed Oct. 18, 1999.

BACKGROUND OF THE INVENTION

1. Field of Invention

The present invention relates to a method for manufacturing a stacked capacitor of a dynamic random access memory (DRAM). More particularly, the present invention relates to a method for manufacturing a stacked capacitor with a metalinsulator-metal structure.

2. Description of Related Art

A semiconductor memory, such as a DRAM, mainly consists of a transistor and a capacitor. Therefore, improvement in the efficiency of these two structures tends to be the direction in which technology is developing.

When the semiconductor enters the deep sub-micron process, the size of the device becomes smaller. For the conventional DRAM structure, this means that the space used by the capacitor becomes smaller. Since computer software is gradually becoming huge, even more memory capacity is required. In the case where it is necessary to have a smaller size with an increased capacity, the conventional method of fabricating the DRAM capacitor needs to change in order to fulfil the requirements of the trend.

There are two approaches at present for reducing the size of the capacitor while increasing its memory capacity. One way is to select a high-dielectric material, and the other is to increase the surface area of the capacitor.

There are two main types of capacitor that increase capacitor area. These are the deep trench-type and the stacked-type, where the deep trench-type capacitor is formed by digging out a trench with a depth of 6–7 $\mu$m and filling the trench with a conductive layer, a capacitive dielectric layer and a conductive layer in sequence for the capacitor.

The stacked capacitor is a principal method of fabricating the conventional semiconductor capacitor. As this is related to long-term semiconductor capacitor technology, most of the semiconductor manufacturers, such as Micron in USA, NEC in Japan and Samsung in Korea, have developed technology for such a capacitor.

Although crown-type, fin-type, cylinder-type or spread-type capacitor can fit the requirement for forming a DRAM with a relatively high density, it is difficult to form these various capacitors with a capacity of about 256 megabits (Mb) and even more than 40 giga bit (Gb) under the limitation of the design rule.

Accordingly, it is important to use a dielectric layer with a relatively high dielectric constant in the stacked capacitor. In the current process technique, tantalum oxide ($Ta_2O_5$) with a dielectric constant of about 25 and barium titanate ($BaTiO_3$) with a dielectric constant higher than about a hundred are popular dielectric materials possessing a relatively high dielectric constant.

When a dielectric material with a relatively high dielectric constant is used in a stacked capacitor, the materials for manufacturing the upper and the bottom electrodes need to be gradually replaced in order to enhance the performance of the capacitor. A structure known as a metal-insulator-metal (MIM) structure possesses a low-interfacial reaction specificity to enhance the performance of the capacitor. Therefore, it has become an important topic of research for the semiconductor capacitor in the future.

FIGS. 1A through 1B are schematic, cross-sectional views of the conventional process for manufacturing a stacked capacitor with a MIM structure.

As shown in FIG. 1A, an oxide layer 102 is formed on a substrate 100. A patterning process is performed to form a storage node contact hole 104 in the oxide layer 102. A polysilicon plug 106 is formed in the storage node contact hole 104.

The method for forming a polysilicon plug 106 comprises steps of forming a polysilicon layer on the oxide layer 102 and to fill the storage node contact hole 104, and then removing a portion of the polysilicon layer above the oxide layer 102 by etching back.

A metal barrier layer 108 and a metal layer 110 are formed on the oxide layer 102 and the polysilicon plug 106 in sequence. The metal layer 110 is made of platinum (Pt).

As shown in FIG. 1B, a photolithography and etching process is performed to pattern the metal layer 110 and the metal barrier layer 108 to form a patterned metal layer 110a and a patterned metal barrier layer 108a. The patterned metal layer 110a and the patterned metal barrier layer 108a together form a storage node 112 of a bottom electrode.

A dielectric layer 114 with a high dielectric constant and a metal layer 116 are formed on the storage node 112 and the oxide layer 102 in sequence. The dielectric layer 114 is made of barium strontium titanate ($BaSrTiO_3$, BST) and is used as a capacitor dielectric layer in the capacitor. The metal layer 116 is used as an upper electrode of a capacitor and is made of Pt.

After the stacked capacitor with high capacitance is formed, the subsequent processes for manufacturing a DRAM are well known to people skilled in the art, so these procedures will not be described herein.

However, Pt is very expensive and the minimum thickness of a Pt layer is limited to increase the surface area of the bottom electrode of the capacitor. Therefore, the cost of the process is high. Incidentally, in the process for patterning Pt, since Pt is difficult to etch by dry etching and the minimum thickness of Pt layer is limited, the critical dimension (CD) is extremely difficult to control.

Moreover, when the BST layer with a high dielectric constant is formed on the storage node, in order to maintain the dielectric specificity of BST, the BST layer is formed in an environment full of oxygen. However, the conductivity of the metal barrier layer is lost as the metal barrier layer is oxidized, and the reliability of capacitor is decreased.

Furthermore, the junction between the BST layer and the metal barrier layer is a low schottky barrier. Therefore, the dielectric leakage current is large if the BST layer electrically contacts the metal barrier layer.

SUMMARY OF THE INVENTION

The invention provides a method of manufacturing a stacked capacitor. A substrate is provided. A first dielectric layer is formed over the substrate. A first nitride layer is formed on the first dielectric layer. A storage node contact hole is formed to penetrate through the first nitride layer and the first dielectric layer and to expose a portion of the substrate. A first conductive plug is formed in the storage node contact hole. A second dielectric layer is formed on the first nitride layer and the first conductive plug. A second nitride layer is formed on the second dielectric layer. A contact hole is formed to penetrate through the second nitride layer and the second dielectric layer and to expose portions of the first conductive plug. A second conductive plug is formed in the contact hole with a surface level lower than a surface level of the second nitride layer. A metal barrier layer is formed on the second conductive plug and fills the contact hole. A first metal layer is formed over the substrate. The first metal layer, the second nitride layer and the second dielectric layer are patterned to form a storage node. The storage node comprises the second conductive plug and the metal barrier layer. A metal spacer is formed on the sidewall of the storage node. A third dielectric layer is formed over the substrate. A second metal layer is formed on the third dielectric layer.

In the invention, since the metal barrier layer is formed between the second conductive plug and the first metal layer, the chemical interaction between the second conductive plug and the first metal layer can be avoided even when the first metal layer and the second conductive plug are made of platinum and polysilicon, respectively. Therefore, the performance of the subsequently formed bottom electrode can be greatly improved.

Since the metal barrier layer is enclosed by the second conductive plug, the second nitride layer and the first metal layer, the metal barrier layer is notoxidized when the third dielectric layer is subsequently formed in an environment full of oxygen. Hence, the conductivity of the metal barrier layer is not lost, so the reliability of the capacitor is greatly increased.

Additionally, in the invention, the first metal layer is relatively thin, so that the thickness of the first metal layer is not a limiting factor leading to difficulty in controlling the CD during the formation of the storage node even though the first metal layer is difficult to dry etch.

Moreover, because the first metal layer and the metal spacer are thinner than those formed by the conventional process, the fabrication cost can be decreased even when the first metal layer and the metal spacer are made of an expensive metal material such as platinum.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

FIGS. 2A through 2F are schematic, cross-sectional views of the process for manufacturing a stacked capacitor with a MIM structure in a preferred embodiment according to the invention.

Figure 1A:
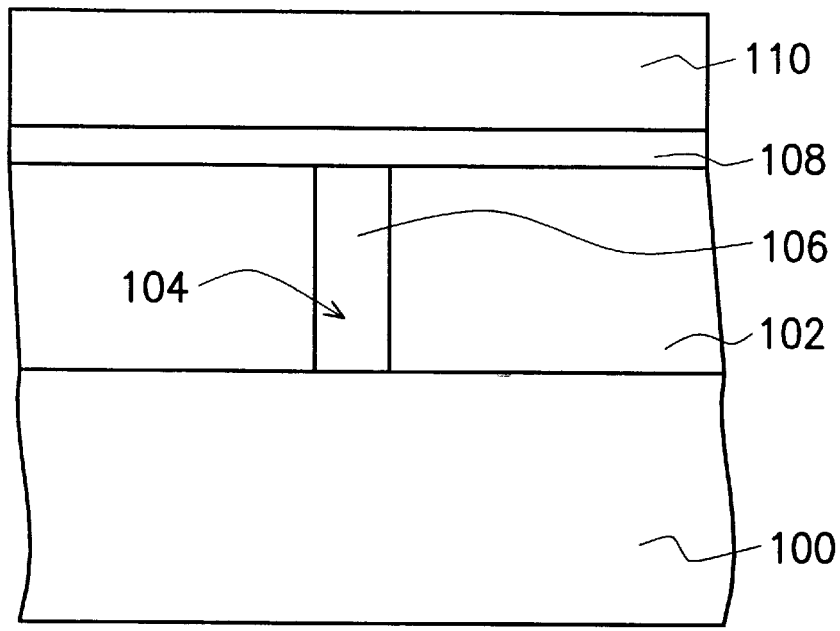
FIGS. 1A through 1B are schematic, cross-sectional views of the conventional process for manufacturing a stacked capacitor with a metal-insulator-metal structure.
Figure 1B:
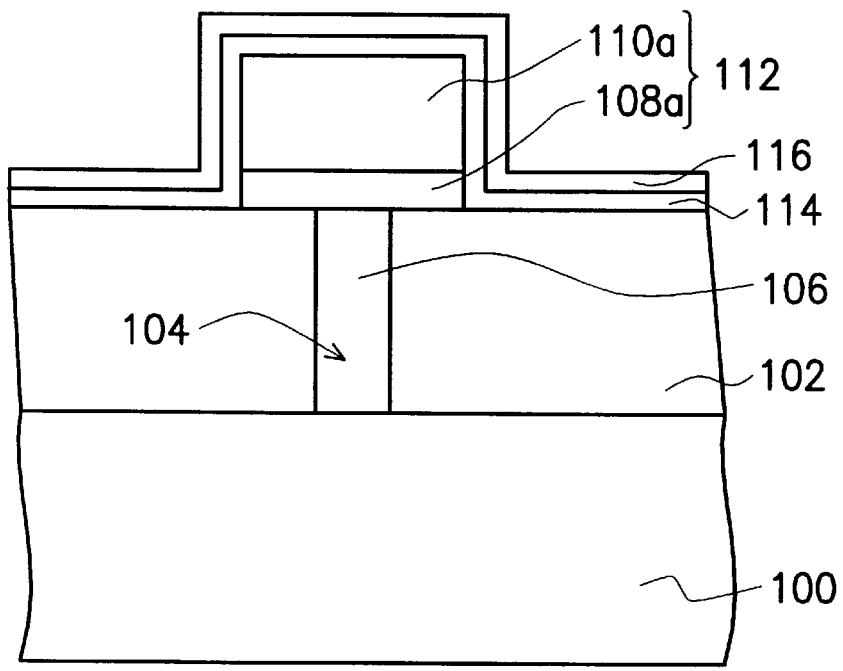
Figure 2A:
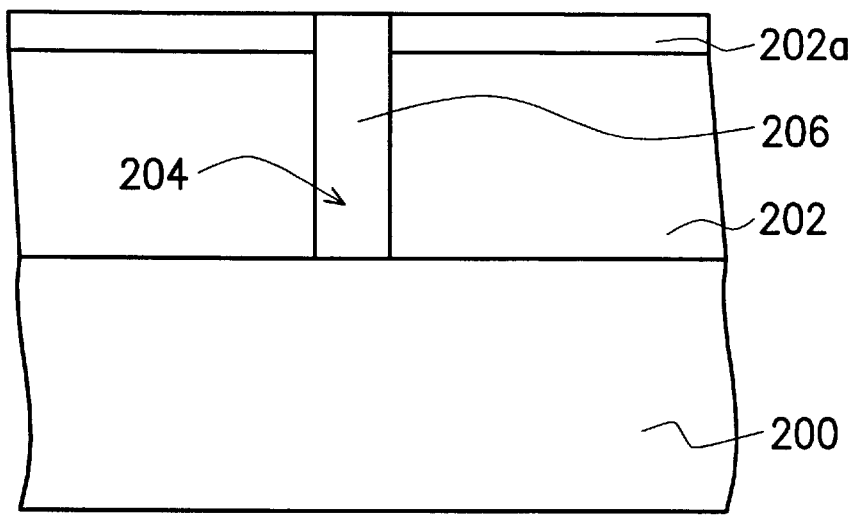
FIGS. 2A through 2F are schematic, cross-sectional views of the process for manufacturing a stacked capacitor with a metal-insulator-metal structure in a preferred embodiment according to the invention.

As shown in FIG. 2A, a dielectric layer 202 is formed on a substrate 200 having several semiconductor devices (not shown) formed therein. The dielectric layer 202 can be formed from silicon oxide by chemical vapor deposition (CVD), for example. A nitridation process is performed to form a nitride layer 202a on the surface of the dielectric layer 202. The nitride layer 202a can be formed from silicon-oxy-nitride (SiON) or silicon nitride by CVD, for example.

The nitridation process is performed in an ammonia environment in order to increase the adhesion between the dielectric layer 202 and the subsequently formed electrode material.

A photolithography and etching process is performed to form a storage node contact hole 204 in the nitride layer 202a and the dielectric layer 202. The storage node contact hole 204 exposes a portion of the substrate 200. The storage node contact hole 204 is filled with conductive material to form a conductive plug 206. The conductive plug 206 can be a polysilicon plug, for example.

The method for forming the conductive plug 206 comprises steps of forming a conductive layer (not shown) to cover the nitride layer 202a and to fill the storage node contact hole 204, and then performing an etching back process to remove a portion of the conductive layer above the nitride layer 202a to form the conductive plug 206.

Figure 2B:
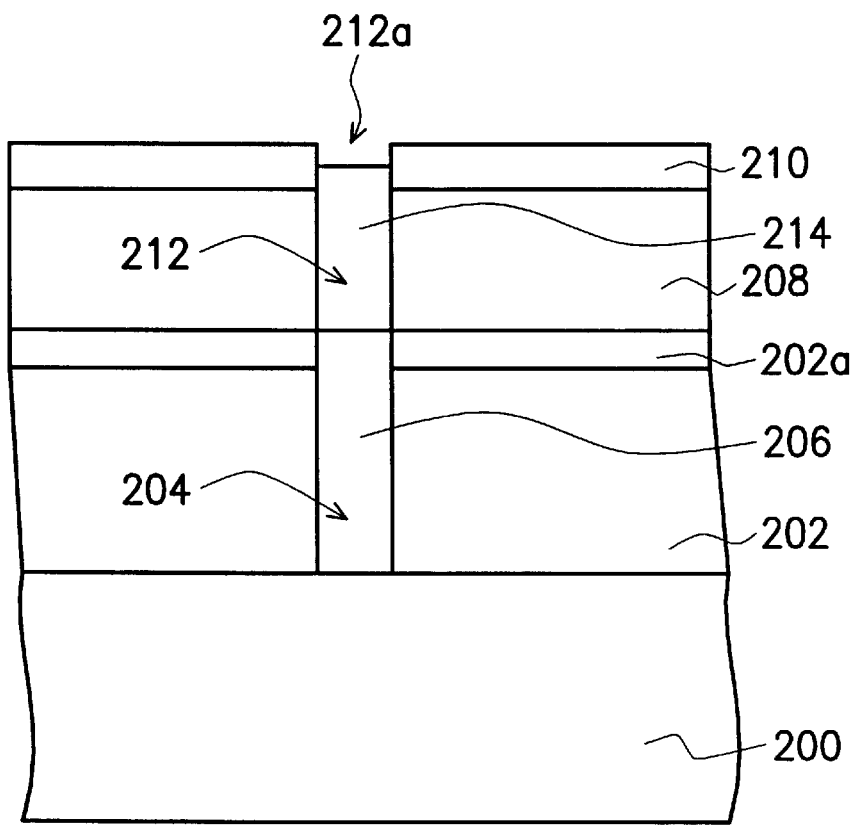

As shown in FIG. 2B, a dielectric layer 208 and a nitride layer 210 are formed on the nitride layer 202a and the conductive plug 206 in sequence. The method of forming the dielectric layer 208 is the same as that of forming the dielectric layer 202 and the material of the dielectric layer 208 is also the same as that of the dielectric layer 202. The thickness of the nitride layer 210 is about 500–1500 angstroms. Additionally, the nitride layer 210 can be formed from silicon nitride by chemical vapor deposition (CVD).

A photolithography and etching process is performed to form a contact hole 212 in the nitride layer 210 and the dielectric layer 208. The contact hole 212 exposes portions of the conductive plug 206. The contact hole 212 is filled with conductive material to form a conductive plug 214 and the surface level of the conductive plug 214 is lower than that of the nitride layer 210. A recess constructed by the conductive plug 214 and the nitride layer 210 is denoted as a recess 212a. The conductive plug 214 electrically contacts the conductive plug 206. The conductive plug 214 can be a polysilicon plug, for example.

The method for forming the conductive plug 214 comprises the steps of forming a conductive layer (not shown) over the nitride layer 210 to fill the contact hole 212, and then performing an over-etching process to remove a portion of the conductive layer above the nitride layer 210 and over the top of the contact hole 212 to form the conductive plug 214 and the recess 212a over the conductive plug 214.

Figure 2C:
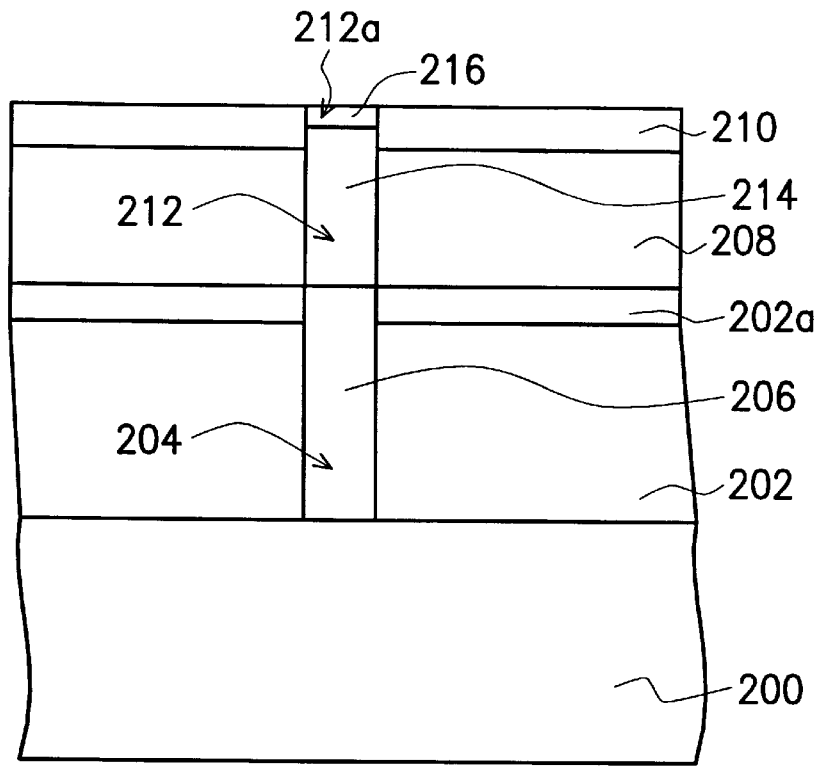

As shown in FIG. 2C, a metal barrier layer 216 is formed to fill the recess 212a in the contact hole 212. The metal barrier layer can be made of titanium nitride, tungsten nitride or tantalum nitride, for example. The method of forming the metal barrier layer 216 comprises the steps of forming a metal barrier layer (not shown) on the nitride layer 210 and on the conductive plug 214 to fill the recess 212a by sputtering, and then performing an etching back process to remove a portion of the metal barrier layer above the nitride layer 210. The etching back process can be a reactive ion etching (RIE), for example.

Figure 2D:
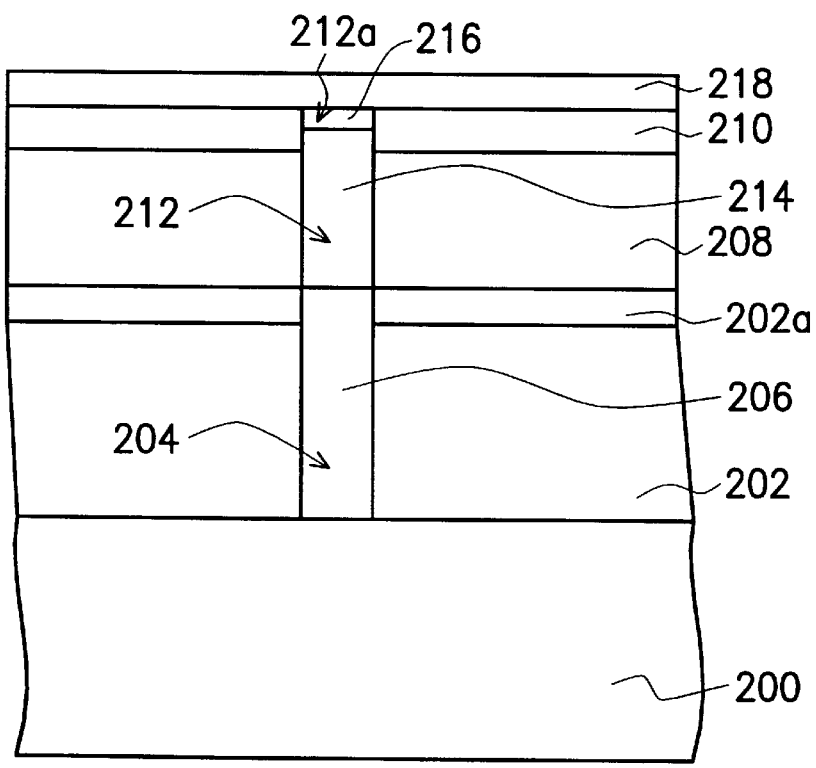

The metal barrier layer 216 is used to prevent the conductive plug 214 from immediate contact with the subsequently formed metal layer 218 (as shown in FIG. 2D). Therefore, the chemical reaction between the conductive plug 214 and the metal layer 218 can be avoided.

As shown in FIG. 2D, a metal layer 218 is formed on the nitride layer 210 and the metal barrier layer 216. The metal layer 218 located on the top of the storage node is electrically contacted by the conductive plug 206 formed in the storage node contact hole 204 through the metal barrier layer 216 and the conductive plug 214 formed in the contact hole 212. The metal layer 218 can be formed from platinum by physical vapor deposition (PVD), for example. The thickness of the metal layer 218 is about 800–2000 angstroms. The metal layer 218 is thinner than the metal layer formed by the conventional process, so the fabrication cost is low.

Figure 2E:
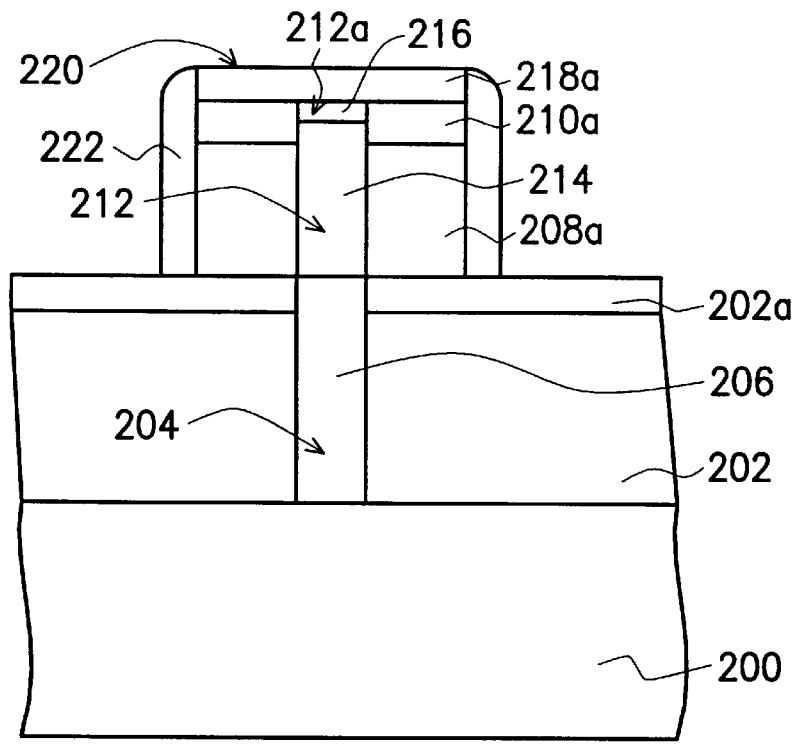

As shown in FIG. 2E, the metal layer 218, the nitride layer 210 and the dielectric layer 208 are patterned to form a storage node 220. The storage node 220 is constructed from patterned metal layer 218a, patterned nitride layer 210a, patterned dielectric layer 208a, metal barrier layer 216 and conductive plug 214.

Since the metal layer 218 is thinner than the metal layer formed by the conventional process, the thickness of the metal layer 218 is not a limiting factor leading to difficulty in controlling CD during the formation of the storage node 220 even though the metal layer 218 is difficult to dry etch.

A metal spacer 222 is formed on the sidewall of the storage node 220. The metal spacer 222 and the storage node 220 together form a bottom electrode. The method of forming the metal spacer 222 comprises the steps of forming a metal layer (not shown) with a thickness of about 300–800 angstroms over the substrate, and then performing an etching back process to remove a portion of the metal layer and to form the metal spacer 222. The method for forming the metal layer can be a PVD, for example. The etching back process can be a RIE, for example. Moreover, when the metal spacer 222 is made of an expensive material such as platinum, because the metal spacer 222 is relatively thin, the cost is still low.

Figure 2F:
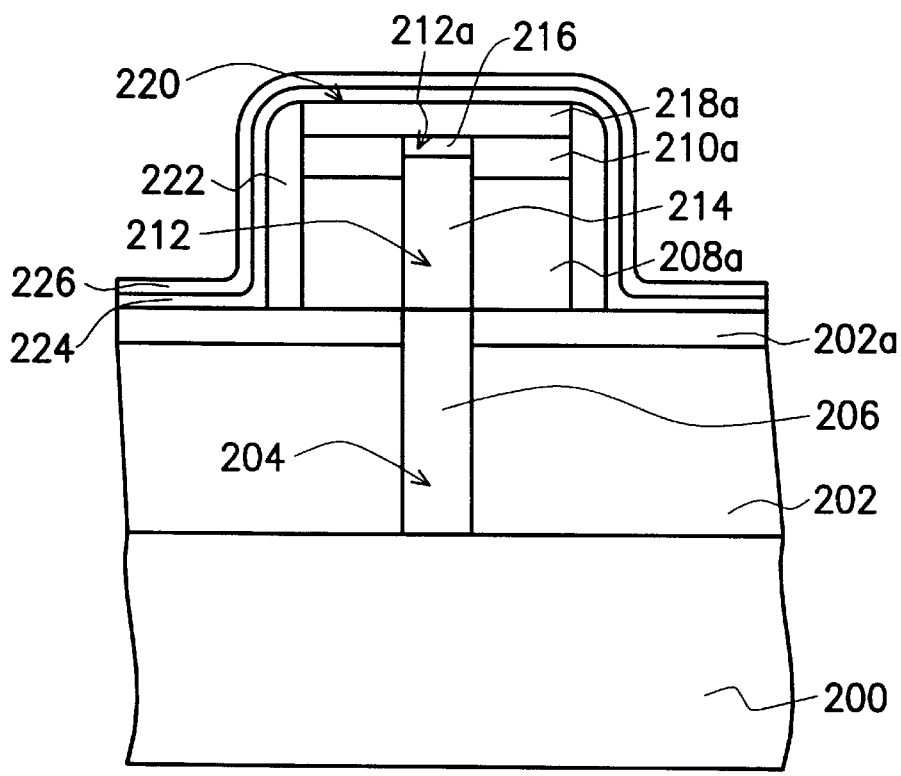

As shown in FIG. 2F, a dielectric layer 224 with a relatively high dielectric constant and a metal layer 226 are formed in sequence on the nitride layer 202a, the storage node 220 and the metal spacer 222. The dielectric layer 224 is used as a capacitor dielectric layer and the metal layer 226 is used as an upper electrode of the capacitor. The dielectric layer 224 can be made of $BaTiO_3$, for example. Preferably, the dielectric layer 224 can be a BST layer formed in an environment full of oxygen by sputtering or metal organic chemical vapor deposition (MOCVD). The metal layer 226 is formed from platinum by PVD, for example.

Since the metal barrier layer 216 fills the recess 212a in the contact hole 212, the sidewall of the metal barrier layer 216 is enclosed by the nitride layer 210a and the metal barrier layer 216 is covered by the metal layer 218a, the metal barrier layer 216 will not be oxidized while the capacitor dielectric layer 224 with a high dielectric constant is subsequently formed in an environment full of oxygen. Hence, the conductivity of the metal barrier layer 216 is not lost, so the reliability of the capacitor is greatly increased.

The procedure for manufacturing a stacked capacitor with a high capacitance is finished. The subsequent processes for manufacturing a DRAM are well known to people skilled in the art, so those procedures are not described herein.

In the invention, since the metal barrier layer is formed between the conductive plug and the metal layer, the chemical interaction between the conductive plug and the metal layer can be avoided even when the metal layer and the conductive plug are respectively made of platinum and polysilicon. Therefore, the performance of the bottom electrode can be greatly improved.

Since the metal barrier layer is enclosed by the conductive plug, the nitride layer and the metal layer, the metal barrier layer will not be oxidized while the capacitor dielectric layer with a high dielectric constant is subsequently formed in an environment full of oxygen. Hence, the conductivity of the metal barrier layer is not lost, so the reliability of the capacitor is greatly increased.

In the invention, the metal layer of the storage node is relatively thin, so that the thickness of the metal layer is not a limiting factor leading to the difficult controlling of CD during the formation of the storage node even though the metal layer is difficult to dry etch.

Moreover, because the metal layer and the metal spacer are thinner than that formed by the conventional process, the fabrication cost can be decreased even when the metal layer and the metal spacer are made of expensive metal material such as platinum.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a stacked capacitor, comprising the steps of:

proving a substrate;

forming a first dielectric layer over the substrate;

forming a first nitride layer on the first dielectric layer;

forming a storage node contact hole penetrating through the first nitride layer and the first dielectric layer to expose a portion of the substrate;

forming a first conductive plug in the storage node contact hole;

forming a second dielectric layer on the first nitride layer and the first conductive plug;

forming a second nitride layer on the second dielectric layer;

forming a contact hole penetrating through the second nitride layer and the second dielectric layer to expose a portion of the first conductive plug;

forming a second conductive plug in the contact hole with a surface level lower than a surface level of the second nitride layer;

forming a metal barrier layer on the second conductive plug and filling the contact hole;

forming a first metal layer over the substrate;

patterning the first metal layer, the second nitride layer and the second dielectric layer to form a storage node, wherein the storage node comprises the second conductive plug and the metal barrier layer;

forming a metal spacer on the sidewall of the storage node;

forming a third dielectric layer over the substrate; and forming a second metal layer on the third dielectric layer.

2. The method of claim 1, wherein the first dielectric layer and the second dielectric layer are made of silicon oxide.

3. The method of claim 1, wherein the first dielectric layer and the second dielectric layer are formed by chemical vapor deposition.

4. The method of claim 1, wherein a thickness of the second nitride layer is about 500–1500 angstroms.

5. The method of claim 1, wherein the first nitride layer is made of silicon oxynitride.

6. The method of claim 1, wherein the first nitride layer and the second nitride layer are made of silicon nitride.

7. The method of claim 1, wherein the first conductive plug and second conductive plug are made of polysilicon.

8. The method of claim 1, wherein the metal barrier layer is made of titanium nitride, tungsten nitride or tantalum nitride.

9. The method of claim 1, wherein the first metal layer is made of platinum.

10. The method of claim 1, wherein a thickness of the first metal layer is about 800–2000 angstroms.

11. The method of claim 1, wherein the step of forming the metal spacer comprises the steps of:

forming a third metal layer over the substrate; and performing an etching back process to form the metal spacer.

12. The method of claim 11, wherein a thickness of the third metal layer is about 300–800 angstroms.

13. The method of claim 1, wherein the metal spacer is made of platinum.

14. The method of claim 1, wherein the third dielectric layer is made of barium titanate.

15. The method of claim 1, wherein the third dielectric layer is made of barium strontium titanate.

16. A method of manufacturing a stacked capacitor, comprising the steps of:

proving a substrate;

forming a first silicon oxide layer over the substrate;

forming a first silicon nitride layer on the first layer;

forming a storage node contact hole penetrating through the first silicon nitride layer and the first silicon oxide layer to expose a portion of the substrate;

forming a first polysilicon plug in the storage node contact hole;

forming a second silicon oxide layer on the first silicon nitride layer and the first polysilicon plug;

forming a second silicon nitride layer on the second silicon oxide layer;

forming a contact hole penetrating through the second silicon nitride layer and the second silicon oxide layer to expose portions of the first polysilicon plug;

forming a second polysilicon plug in the contact hole with a surface level lower than a surface level of the second silicon nitride layer;

forming a metal barrier layer on the second conductive plug and filling the contact hole;

forming a platinum layer over the substrate;

patterning the platinum layer, the second silicon nitride layer and the second silicon oxide layer to form a storage node, wherein the storage node comprises the second polysilicon plug and the metal barrier layer;

forming a metal spacer on the sidewall of the storage node;

forming a barium strontium titanate layer over the substrate; and forming a first metal layer on the barium strontium titanate layer.

17. The method of claim 16, wherein the first silicon nitride layer and the second silicon nitride layer are formed by chemical vapor deposition.

18. The method of claim 16, wherein a thickness of the second silicon nitride layer is about 500–1500 angstroms.

19. The method of claim 16, wherein the metal barrier layer is made of titanium nitride, tungsten nitride or tantalum nitride.

20. The method of claim 16, wherein a thickness of the platinum layer is about 800–2000 angstroms.

21. The method of claim 16, wherein the step of forming the metal spacer comprises the steps of:

forming a second metal layer over the substrate; and performing an etching back process to form the metal spacer.

22. The method of claim 21, wherein a thickness of the second metal layer is about 300–800 angstroms.

23. The method of claim 16, wherein the metal spacer is made of platinum.

* * * * *